United States Patent [19]

Kawashima et al.

[11] Patent Number: 5,124,562
[45] Date of Patent: Jun. 23, 1992

[54] SURFACE POSITION DETECTING METHOD AT A PREDETERMINED AND PLURALITY OF ADJACENT POINTS

[75] Inventors: Haruna Kawashima, Kawasaki; Akiyoshi Suzuki, Tokyo, both of Japan

[73] Assignee: Canon Kabushiki Kaisha, Tokyo, Japan

[21] Appl. No.: 734,097

[22] Filed: Jul. 23, 1991

Related U.S. Application Data

[63] Continuation of Ser. No. 470,594, Jan. 26, 1990, abandoned.

[30] Foreign Application Priority Data

Jan. 27, 1989 [JP] Japan ................ 1-018005

[51] Int. Cl.⁵ .............................. G01N 21/86
[52] U.S. Cl. ...................... 250/548; 356/375
[58] Field of Search ............... 250/548, 557; 356/400, 356/401, 376, 355

[56] References Cited

U.S. PATENT DOCUMENTS

| | | | |
|---|---|---|---|
| 4,167,677 | 9/1979 | Suzki ................ | 356/401 |
| 4,395,117 | 7/1983 | Suzuki ............... | 355/43 |
| 4,558,949 | 12/1985 | Uehara et al. ....... | 356/375 |
| 4,579,453 | 4/1986 | Makita .............. | 250/548 |
| 4,723,845 | 2/1988 | Mizutani et al. ..... | 356/375 |
| 4,780,615 | 10/1988 | Suzuki .............. | 250/548 |
| 4,795,911 | 1/1989 | Kohno et al. ........ | 250/572 |
| 4,823,014 | 4/1989 | Miyawaki ........... | 356/375 |
| 4,874,954 | 10/1989 | Takahashi et al. .... | 250/548 |

FOREIGN PATENT DOCUMENTS 140418 6/1987 Japan .

*Primary Examiner*—David C. Nelms
*Assistant Examiner*—Que T. Le
*Attorney, Agent, or Firm*—Fitzpatrick, Cella, Harper & Scinto

[57] ABSTRACT

A surface position detecting method wherein a surface on which a predetermined pattern is formed is measured by use of a measuring device to obtain a surface position data related thereto and, on the basis of the obtained surface position data, the surface position of the surface being examined is detected, the method including a measuring step for relatively moving the measuring device and the surface being examined, in a direction substantially parallel to the surface being examined, and sequentially measuring different points on the surface being examined by use of the measuring device; and a detecting step for detecting the surface position of the surface being examined, in a direction substantially perpendicular thereto, on the basis of a plurality of surface position data obtained through the measuring step.

61 Claims, 8 Drawing Sheets

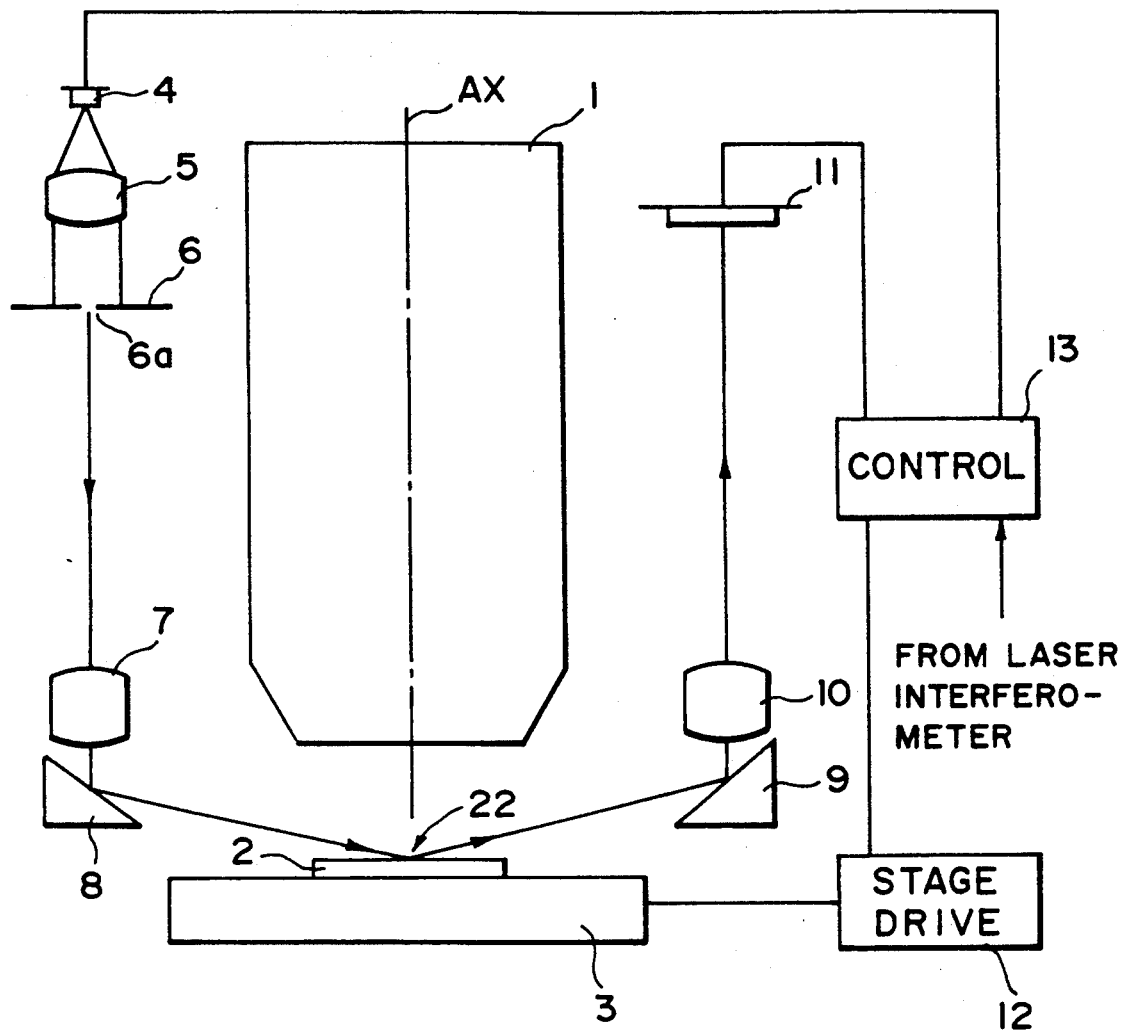
F I G. 1

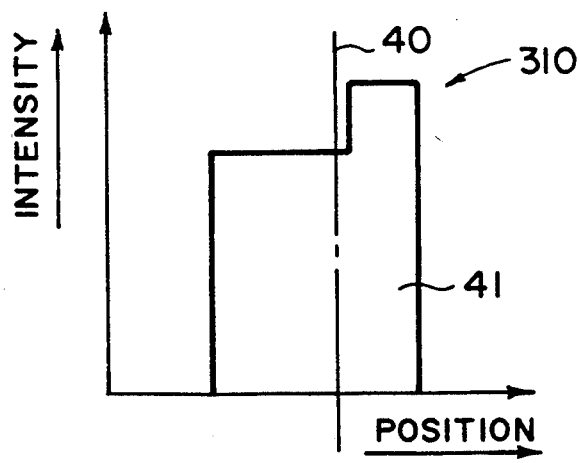
F I G. 4A
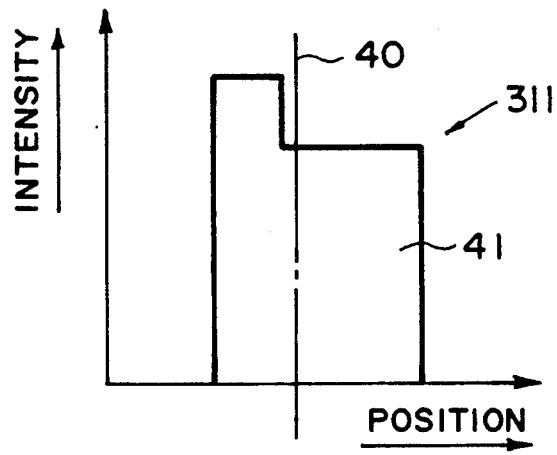
F I G. 4B
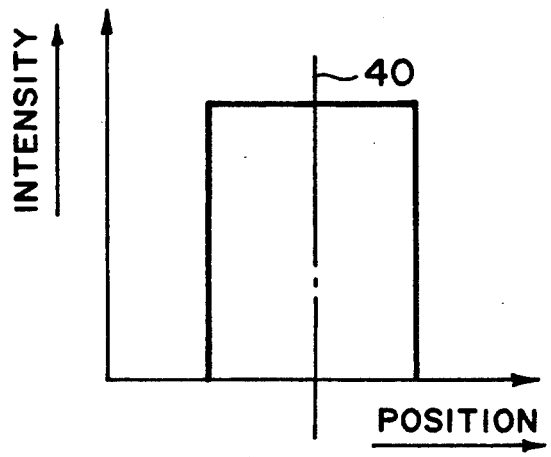
F I G. 5

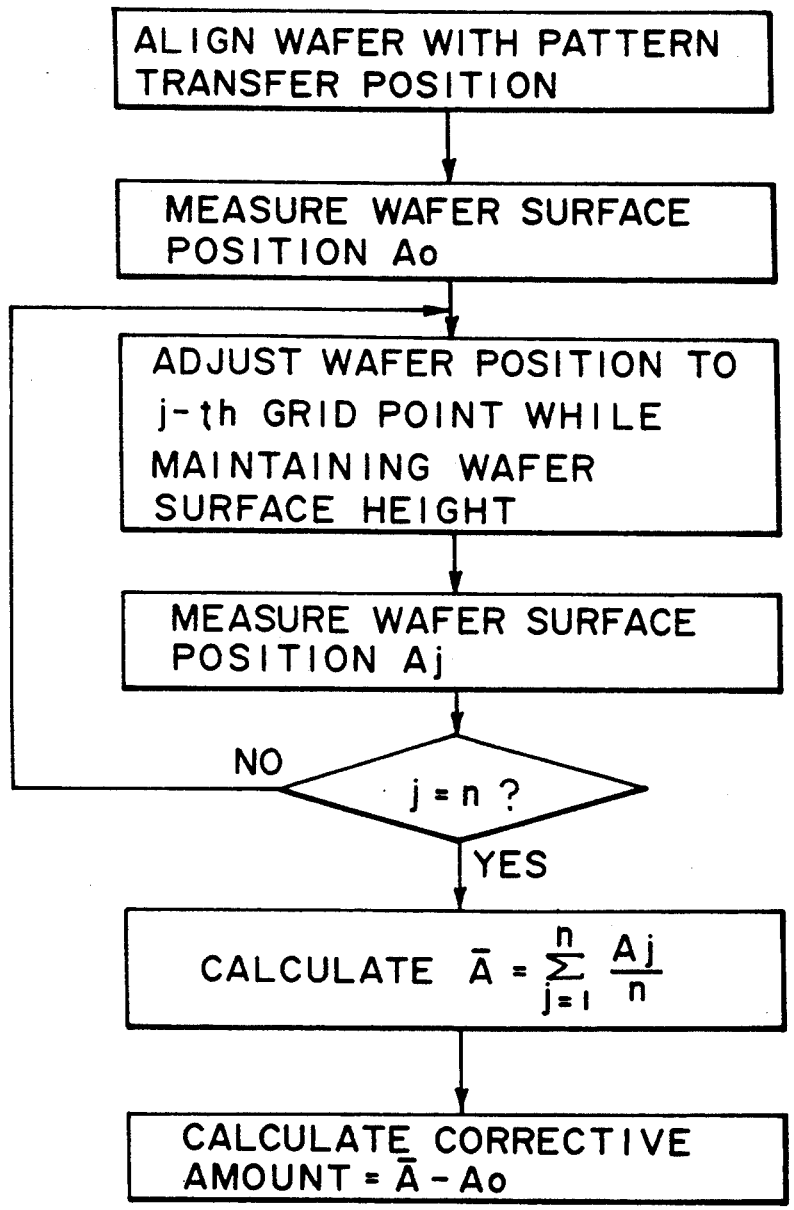
F I G. 6

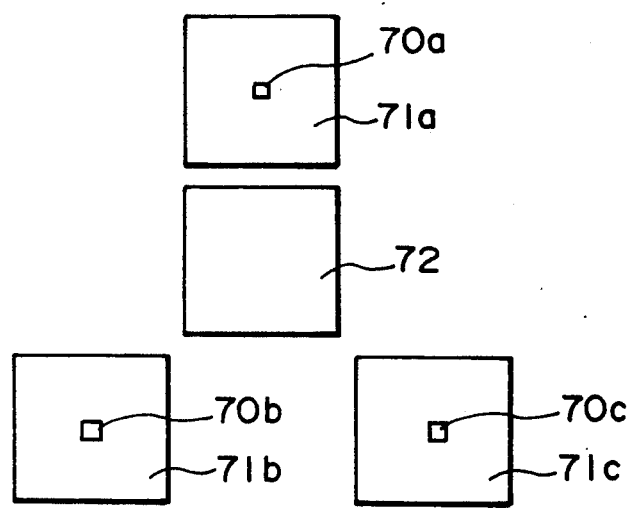
F I G. 7

SURFACE POSITION DETECTING METHOD AT A PREDETERMINED AND PLURALITY OF ADJACENT POINTS

This application is a continuation of application Ser. No. 07/470,594 filed Jan. 26, 1990, now abandoned.

FIELD OF THE INVENTION AND RELATED ART

This invention relates to a surface position detecting method. More particularly, the invention is concerned with a surface position detecting method, usable in a reduction projection exposure apparatus for projecting, in a reduced scale, a pattern of a reticle onto a surface of a semiconductor wafer, for detecting in sequence the surface positions of different pattern areas on the semiconductor wafer with respect to an imaging plane of the reticle pattern projected by a projection optical system.

An example of a wafer surface position measuring method in a reduction projection exposure apparatus is disclosed in Japanese Laid-Open Patent Application, Laid-Open Patent No. Sho 62-140418 filed in the name of the assignees of the subject application. Disclosed in this publication is an optical type measuring method wherein a light beam is inputted to the surface of a wafer from an inclined direction and the position of the wafer surface is measured by detecting any positional deviation of reflected light from the wafer surface upon a position sensor, resulting from a change in the position of the wafer surface.

In this optical type measuring method, however, there is a possibility of interference between the light reflected by the surface of a resist applied to the wafer and the light passing through the resist and reflected by the surface of the wafer substrate, which interference results in a detection error. In consideration thereof, to reduce such a detection error, in the aforementioned Japanese Laid-Open Patent Application, Laid-Open No. Sho 62-140418, a plurality of light beams having different wavelengths are inputted to the wafer surface so as to average the interference action of the light reflected by the surface of the resist and the light reflected by the surface of the wafer substrate, thereby to enhance the precision of the surface position detection.

On the other hand, it has been found that, in addition to the above-described interference phenomenon, there is another factor that can cause a detection error in relation to the detection of surface position. This is a possibility that the light reflected from the wafer surface is affected by a pattern formed on the wafer substrate during the preceding wafer process with a result of formation of an intensity distribution corresponding to the reflectance distribution of the pattern. The detection error resulting from such a phenomenon differs depending on the disposition of the pattern formed on the wafer surface and, therefore, different wafers having been processed by different manufacturing processes may have different errors. Accordingly, it can be said that, at the time of surface position detection, for different processes there are different detection errors, respectively.

In the past, such detection errors originated from the different processes, respectively, due to the patterns formed on the wafer substrates, were considered as being small as compared with the depth of focus of a projection optical system and thus they were disregarded in the manufacture of semiconductor devices. Recently, however, with further enhancement of miniaturization of circuit patterns of semiconductor devices, a higher resolving power is required in the projection exposure apparatus and, as a result of an increase in the numerical aperture of the projection optical system in an attempt to meet such a requirement, the depth of focus of the projection optical system is reduced. Therefore, at present, it is not desirable to disregard such detection errors which are different with different processes.

Thus, now there is a necessity of detecting, at each process, such a detection error which is produced under the influence of a pattern of a wafer substrate and which is different with a different process, and of correcting this detection error as an offset peculiar to a particular process. Accordingly, by way of example, such a method may be considered wherein an image of a pattern of a reticle is actually printed on a wafer and the image of the pattern transferred to the wafer is observed through a microscope to determine a corrective amount effective to enhance the resolution of the image of the pattern.

However, in such a method wherein actual printing is effected and a detection error of each process is determined, there is a necessity of executing repetitions of printing and examination of transferred pattern images by using a microscope. This is very complicated and time-consuming work.

Therefore, execution of pattern transfer and an observation operation for every wafer process requires an extraordinarily long time in the manufacture of semiconductor devices, and results in an increase in the manufacturing cost.

Further, with the method in which the image of the transferred pattern is examined by using a microscope, it is not possible to detect any detection error with sufficient precision. Accordingly, even if a detection error is detected with such a method and the result of measurement of the wafer surface position is corrected, there will remain not a small error and, therefore, it is not easy to detect the wafer surface position with good precision.

SUMMARY OF THE INVENTION

It is accordingly a primary object of the present invention to provide a surface position detecting method by which the surface position of an object such as the surface of a wafer, on which a certain pattern is formed, can be detected with good precision.

It is another object of the present invention to provide a surface position detecting method by which the surface position of such an object can be detected quickly and with high precision.

In accordance with an aspect of the present invention, to achieve at least one of these objects, there is provided a surface position detecting method wherein a surface on which a predetermined pattern is formed is measured by use of a measuring means to obtain surface position data related thereto and, on the basis of the obtained surface position data, the surface position of the surface being examined is detected, said method comprising:

a measuring step for relatively moving the measuring means and the surface being examined, in a direction substantially parallel to the surface being examined, and sequentially measuring different points on the surface being examined by use of the measuring means; and a detecting step for detecting the surface position of the surface being examined, in a direction substantially perpendicular thereto, on the basis of a plurality of surface position data obtained through the measuring step.

In one preferred form, the measuring means may comprise a sensor which is operable to optically measure the surface position of the surface being examined. The sensor may be arranged so that a radiation beam is projected to the surface being examined and a reflection beam produced as a result of reflection of the projected beam by the surface being examined is received by a detector, by which it is converted into a signal (surface position data). On an occasion when the surface to be examined is the surface of a semiconductor wafer having a pattern formed thereon and being coated with a resist, a light beam with respect to which the resist on the wafer is not sensitive (e.g. an infrared beam) may be used as the radiation beam.

The relative movement of the measuring means and the surface being examined may be made by displacing the surface being examined while holding the measuring means immovable. For displacement of the surface being examined, an article which bears the surface being examined may be placed on a movable stage and the movable stage may be moved in a direction substantially parallel to the surface being examined. As a matter of course, the present invention is not limited to this, and the relative movement may be made by displacing the measuring means while holding the surface being examined immovable.

The measuring step may be effected either without stopping the relative movement of the measuring means and the surface being examined, or interrupting the relative movement for measurement of each point on the surface being examined.

Basically, at the detecting step, the values of plural surface position data may be averaged to exclude or cancel the affect of the pattern on the surface being examined, to the respective surface position data, to thereby allow high-precision detection of the surface position of the surface being examined. However, the plural surface position data may be processed in a different manner, in order to cancel the affect of the pattern on the surface being examined, to the surface position data obtainable from the measuring means.

On the basis of the principle of such a surface position detecting method, the present invention in another aspect provides an error detecting method which is effective to detect any error resulting from the effect of a pattern on the surface being examined and included in the surface position data obtainable from the measuring means. Thus, in accordance with one form of this aspect of the present invention, there is provided an error detecting method usable in a system for measuring through a measuring means a predetermined point on a surface to be examined on which a predetermined pattern is formed, to obtain surface position data related to the surface and for detecting the surface position related to the predetermined point on the surface being examined, on the basis of the obtained surface position data, wherein said method is effective to detect any error in the surface position data resulting from an effect of the pattern on the surface being examined and comprises:

a measuring step for relatively moving the measuring means and the surface being examined, in a direction substantially parallel to the surface being examined, and sequentially measuring the predetermined point on the surface being examined and a plurality of points thereon adjacent to the predetermined point by use of the measuring means;

a first determining step for determining the surface position, with respect to the predetermined point, of the surface being examined on the basis of a plurality of surface position data obtained through the measuring step;

a second determining step for determining the surface position, with respect to the predetermined point, of the surface being examined on the basis of surface position data related to the predetermined point and obtained through the measuring step; and a detecting step for detecting any error in the surface position data related to the surface being examined, on the basis of any difference between the surface positions determined through the first and second determining steps.

Also, in accordance with a further aspect of the present invention, there is provided a method usable in an apparatus for projecting through a projection optical system a first pattern formed on a first object onto a second object having a second pattern formed thereon, for detecting a surface position of the second object with respect to a direction of an optical axis of the projection optical system on the basis of a signal from a detector obtained by irradiating the surface of the second object with a radiation beam and by converting into the signal the beam reflected from the second object and received by the detector, said method comprising:

a beam irradiation and signal conversion step for moving the second object in a direction substantially perpendicular to the optical axis of the projection optical system and effecting the beam irradiation and signal conversion to different points on the surface of the second object; and a detecting step for detecting the surface position of the second object, on the basis of a plurality of signals obtained through the beam irradiation and signal conversion step.

Further, in accordance with a still further aspect of the present invention, there is provided a method usable in an apparatus for projecting through a projection optical system a first pattern formed on a first object onto each of different pattern areas arrayed on a second object and having respective second patterns, for detecting surface positions of a first and second pattern areas on the second object with respect to a direction of an optical axis of the projection optical system, wherein said method is of a type that the surface position of a given pattern area can be detected on the basis of a signal from a detector obtained by irradiating a surface of the given pattern area with a radiation beam and by converting into the signal the beam reflected from the surface and received by the detector, said method comprising:

a first measuring step for moving the second object in a direction substantially perpendicular to the optical axis of the projection optical system, and effecting the beam irradiation and signal conversion to a predetermined point on the first pattern area and to a plurality of points adjacent to the predetermined point;

a first detecting step for detecting a surface position of the first pattern area at the predetermined point thereon, on the basis of a plurality of signals obtained through the first measuring step;

a determining step for detecting a difference between the surface position as detected through the first detecting step and the surface position represented by a signal related to the predetermined point and obtained through the first measuring step, to determine an offset value;

a second measuring step for effecting the beam irradiation and signal conversion to a particular point on the second pattern area which corresponds to the predetermined point on the first pattern area; and a second detecting step for correcting a signal obtained through the second measuring step, by use of the offset value determined through the determining step, to detect the surface position of the second pattern area at the particular point.

In accordance with yet a further aspect of the present invention, there is provided a method usable in an apparatus for projecting through a projection optical system a first pattern formed on a first object onto a second object having a second pattern, for detecting a surface position of the second object with respect to a direction of an optical axis of the projection optical system on the basis of a signal from a detector obtained by irradiating the surface of the second object with a radiation beam and by converting, into the signal, the beam reflected by the surface of the second object received by the detector, said method comprising:

a first setting step for setting a third object having the same pattern as the second pattern, at a site below the projection optical system;

a first measuring step for moving the third object in a direction substantially perpendicular to the optical axis of the projection optical system, irradiating with a radiation beam in sequence a predetermined point on the third object and a plurality of points adjacent to the predetermined point, and converting into signals in sequence the beams reflected from the irradiated points and received by the detector;

a first detecting step for detecting the surface position of the third object at the predetermined point, on the basis of signals obtained through the first measuring step;

a determining step for detecting any difference between the surface position as detected through the first detecting step and the surface position as represented by a signal related to the predetermined point and obtained through the first measuring step, to determine an offset value;

a second setting step for setting the second object in place of the third object, at the site below the projection optical system;

a second measuring step for irradiating with a radiation beam a particular point on the second object which corresponds to the predetermined point on the third object, and converting into a signal the beam reflected from the irradiated point and received by the detector; and a second detecting step for correcting the signal obtained through the second measuring step by use of the offset value obtained through the determining step, to detect the surface position of the second object at the particular point.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic diagrammatic view of a major portion of a reduction projection exposure apparatus in which the surface position detecting method of the present invention can be used.

FIGS. 4A and 4B are graphs, respectively, each showing an intensity distribution of reflected light from the wafer which is in the state of FIG. 3A or 3B.

FIG. 5 is a graph showing a case where in the reflected light from the wafer has a uniform intensity distribution.

FIG. 6 is a flow chart, for explaining one embodiment of the position detecting method of the present invention.

FIG. 7 is a schematic view illustrating pattern areas on a wafer, for explaining another embodiment of the surface position detecting method of the present invention.

DESCRIPTION OF THE PREFERRED EMBODIMENTS

Figure 2:
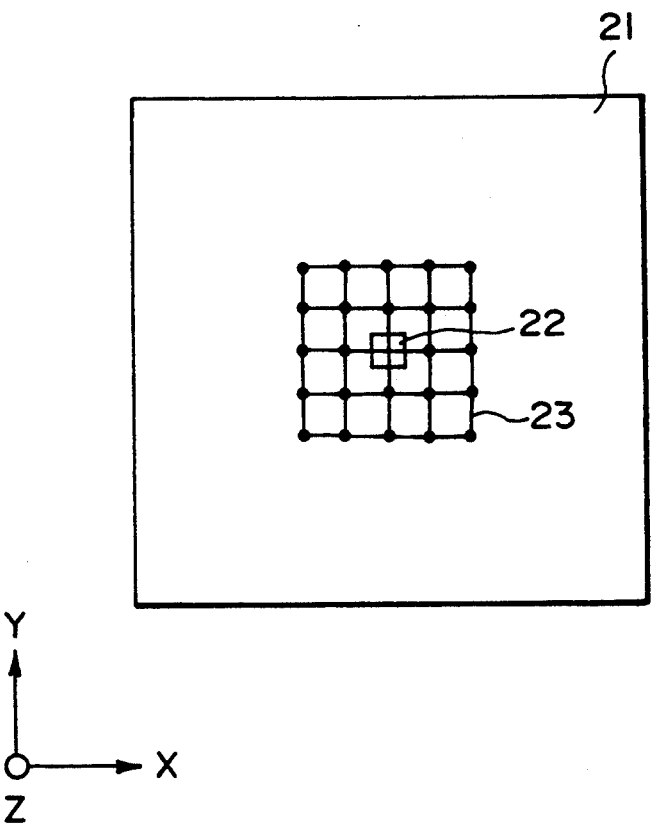
FIG. 2 is a top plan view, illustrating a pattern area on a wafer and points of measurement which are the subject of the surface position detection.

FIG. 1 is a schematic view of a major portion of a reduction projection exposure apparatus for the manufacture of semiconductor devices, which apparatus is provided with an arrangement and a function for detecting the surface position of a semiconductor wafer in accordance with the surface position detecting method of the present invention.

In FIG. 1, denoted at 1 is a reduction projection lens system which has an optical axis AX. The reduction projection lens system 1 serves to project a circuit pattern of a reticle (not shown) in a reduced scale of 1/5–1/20 by use of an exposure energy beam in the ultraviolet region, whereby an image of the pattern of the reticle can be formed at an image plane thereof. The optical axis AX is parallel to a Z-axis direction as illustrated. Denoted at 2 is a wafer coated with a resist material. On the wafer 2, there are a number of arrayed shot areas (pattern areas), to be exposed, having been formed in the preceding step-and-repeat exposure process or processes, by use of the exposure apparatus as illustrated. These areas have formed thereon the same patterns. Denoted at 3 is a stage for carrying thereon the wafer 2, and the wafer 2 is fixed to the wafer stage 3 by attraction. The wafer stage 3 comprises an X stage movable in an X-axis direction, a Y stage movable in a Y-axis direction and a Z stage which is movable in the Z-axis direction (along the optical axis AX) and which is rotatable about the axes parallel to the X, Y and Z axes, respectively. The X, Y and Z axes are set to be orthogonal to each other. As a result, by displacing the wafer stage 3, the position of the wafer 2 with respect to the direction of the optical axis AX of the reduction projection lens system 1 and in a plane perpendicular to the optical axes AX can be adjusted.

Numerals 4-11 in FIG. 1 denote some elements of a measurement optical system which is provided to measure the surface position of each of the or each of preselected ones of the pattern areas on the wafer 2. Denoted at 4 is a high-luminance light source such as a light emitting diode, a semiconductor laser or otherwise, which emits light in an infrared region that does not sensitize the resist on the wafer 2. Denoted at 5 is an illumination lens. The light emanating from the light source 4 is transformed by the illumination lens 5 into substantially parallel light which illuminates a masking member 6 having a pinhole formed therein. The light passing through the pinhole 6a of the mask 6 goes through an imaging lens 7 and impinges on a deflecting mirror 8 by which it is reflected and deflected in a different direction, whereby it is projected onto the surface of the wafer 2 with inclination. Here, with the light from the pinhole 6a, the imaging lens 7 and the deflecting mirror 8 cooperate to form an image of the pinhole 6a of the mask 6 on the wafer 2. The pinhole image irradiates the central part of a pattern region on the wafer 2, and the light is reflected thereat.

The light reflected by the central part of the pattern region of the wafer 2 is then reflected and deflected by a deflecting mirror 9 in a different direction and, thereafter, it goes through a detection lens 10 and impinges on a position detecting element 11. Here, the detection lens 10 cooperates with the imaging lens 7, the deflecting mirror 8, the wafer 2 and the deflecting mirror 9 to form an image of the pinhole of the mask 6 on the position detecting element 11. Thus, the mask 6, the wafer 2 and the position detecting element 11 are at the positions which are mutually in an optically conjugate relationship.

The position detecting element 11 may comprise a CCD or a position sensor, for example, and is operable to detect the position of incidence of the reflected light from the wafer 2 upon a light receiving surface of the element 11. Since any change in the position of the wafer 2 with respect to the direction of optical axis AX of the reduction projection lens system 1 can be detected as a displacement of the position of incidence of the reflected light upon the position detecting element 11, it is possible to detect the position of the wafer surface, at the central part of the pattern region of the wafer 2, with respect to the direction of the optical axis AX, on the basis of an output signal from the position detecting element 11. Such an output signal from the position detecting element 11 is applied to a control device 13 by way of a signal line.

Displacement of the wafer stage 3 in the X-axis direction or the Y-axis direction can be measured in a well-known manner by use of a laser interferometer, not shown, and a signal indicative of the amount of displacement of the wafer stage 3 is applied from the unshown laser interferometer to the control device 13 by way of a signal line. Also, the movement of the wafer stage 3 is controlled by a stage driving means 12 which is operable to drive the wafer stage 3 in response to an instruction signal supplied thereto from the control device 13 by way of a signal line. The stage driving device 12 includes a first driving means and a second driving means, wherein the first driving means is effective to adjust the position (x, y) of the wafer 2 in a plane perpendicular to the optical axis AX and to adjust the rotational position (θ) of the wafer 2, while the second driving means is effective to adjust the position of the wafer 2 in the direction of the optical axis AX.

The control device 13 serves to process the output signal (surface position data) from the position detecting element 11 in a manner to be described later, and to detect the position of the surface of the wafer 2. On the basis of the result of the detection, it produces and applies a corresponding instruction signal to the stage driving device 12. In response to such an instruction signal, the second driving means of the stage driving device 12 operates to adjust the position of the wafer 2 in the optical axis AX direction.

Details of the surface position detecting method of the present invention will now be explained.

FIG. 2 illustrates a predetermined pattern area 21 which is one of plural pattern areas formed on the wafer 2 shown in FIG. 1, as well as a predetermined examination position 22 (the position at which a pinhole image is formed or to be formed) which is at the central part of the predetermined pattern area 21, to be examined by use of the surface position measuring system (4-11). In the state shown in FIG. 2, the wafer 2 has been correctly aligned with the pattern of the reticle, such that with respect to the X-Y plane the reticle pattern image and the pattern area 21 are substantially correctly coincident with each other. The grating denoted at 23 in FIG. 2 represents those positions at which the surface position measurement is made by use of the measuring system (4-11) while moving the wafer 2 in the X-Y plane in a manner to be described later, and these measuring positions correspond to the grating points (grid points), respectively. On these grating points, the center of the pinhole image is projected in sequence. Accordingly, as is clear from FIG. 2, a plurality of measuring positions are distributed around the position 22 to be examined, with respect to which the surface position is going to be detected. Also, with regard to the remaining pattern areas arrayed on the wafer 2, the position to be examined which is the subject of the surface position detection is set at the central part of each pattern area, like the pattern area 21.

Usually, on an occasion when an image of the reticle pattern is going to be projected onto the wafer 2 so that the reticle pattern is transferred thereto, first the position of the wafer 2 surface at the examination position 22 is measured by use of the measuring system (4-11) and, after the wafer surface is positioned on the imaging plane of the reticle pattern, projection exposure is executed. At the time of this exposure, the examination position 22 is fixed with respect to the pattern area 21. This is also the case with each of the remaining pattern areas.

Figure 3A:
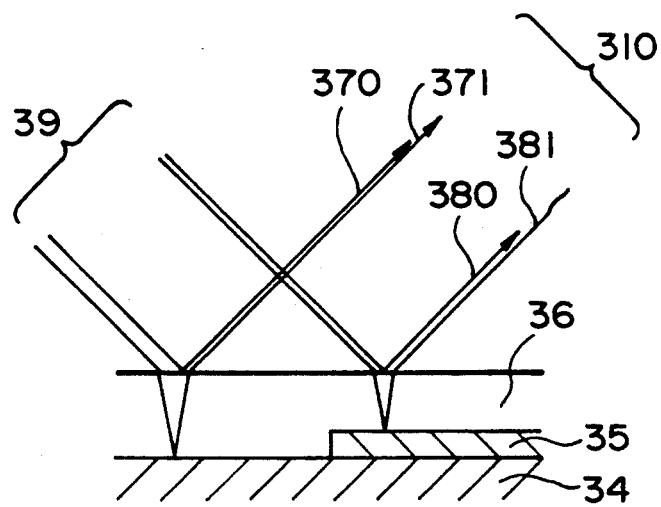
FIGS. 3A and 3B are schematic views, respectively, each showing the action of a measuring light beam inputted to a wafer coated with a resist and having a pattern formed thereon.
Figure 3B:
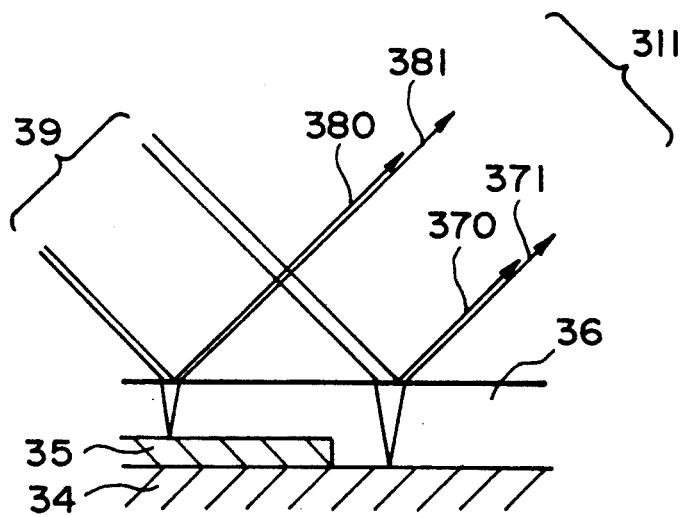

FIGS. 3A and 3B are schematic views, respectively, each illustrating the state of formation of a reflection light beam 310 or 311 showing an intensity distribution varying in its beam diameter, which is produced when a light beam 39 having a fixed beam diameter and having a uniform intensity distribution within the beam diameter is projected onto a wafer coated with a resist 36 and having a pattern 35 formed on its substrate 34 during the preceding process and when the projected light is reflected by the surface of the resist 36 and the surfaces of the pattern 35 and the substrate 34.

On the other hand, FIGS. 4A and 4B are graphs, respectively, each showing an intensity distribution of a light image in the state in which the reflected light beam 310 or 311 formed as a result of reflection by the surfaces of the resist 36, the pattern 35 and the substrate 34, is imaged on a light receiving element.

In FIGS. 3A and 3B, the light beam 39 having a fixed beam diameter and having a uniform intensity distribution within the beam diameter is projected, in an inclined direction, onto a wafer coated with a resist 36. Here, the light beam 39 is separated into a component (370, 380) reflected by the surface of the resist 36, a component 371 transmitted through the resist 36 and reflected by the surface of the wafer substrate 34 and thereafter emerging out of the resist 36, and a component 381 transmitted through the resist 36 and reflected by the surface of the pattern 35 and thereafter emerging out of the resist 36.

In this manner, each of the reflected light beams 310 and 311 from the wafer is composed of a combination of the component 370 reflected by the resist 36 surface and the component 371 reflected by the substrate 34 surface and a combination of the component 380 reflected by the resist 36 surface and the component 381 reflected by the pattern 35 surface. Therefore, if in FIG. 3A or 3B the pattern 35 has a reflection factor higher than that of the substrate 34, then there is formed a reflected light beam 310 or 311 having an intensity distribution 41, varying in its beam diameter, such as illustrated in FIG. 4A or 4B as a light image thereof. More particularly, FIG. 3A corresponds to FIG. 4A, and FIG. 3B corresponds to FIG. 4B. It is seen that, with the position of the pattern 35 in the beam diameter of the inputted light beam 39, the intensity distribution of the reflected light beam within its beam diameter varies.

The light receiving element such as the position detecting element 11 shown in FIG. 1 is set so as to measure the position of a gravity center 40 of the intensity distribution of the reflected light beam, which shows a non-uniform intensity distribution within its beam diameter, as the position of incidence of the reflected light beam upon it. Accordingly, despite that the wafer 2 surface position is fixed with respect to the direction of the optical axis AX of the projection lens system 1, due to the presence of the pattern 35 on the substrate 34, the position of the gravity center 40 of the intensity of the reflected light beam is changeable such as illustrated in FIGS. 4A and 4B, depending upon the relative positional relationship between the pattern 35 and the inputted light beam. Namely, the measured value of the surface position can contain a peculiar detection error which corresponds to the disposition (placement) of the pattern 35. In other words, when the surface position of a pattern area on the wafer is going to be detected, there is a possibility of generation of a detection error corresponding to the pattern structure at the position to be examined.

Referring back to FIG. 2, in a case when the surface positions at the grid points of the grating 23 are to be measured by use of the surface position measuring system (4-11) while moving the wafer stage 3, is considered, generally the position of a pattern placed within the beam diameter of an inputted light beam projected to each grid point is different. As a result, for these grid points, the detection errors produced by the patterns on a wafer substrate are distributed to various values. If the number of grid points and the spacing between these grid points, with respect to which the surface position measurement is to be made, are selected suitably, then any eccentricity in the intensity distribution of each reflected light beam from each point (grid point), due to the affect of a pattern, can be made sufficiently random.

Therefore, the surface positions of a plurality of points (grid points) in the pattern area 21, around and adjacent to the position 22 to be examined which is the subject of the surface position detection, are measured by using the measuring system (4-11). When this is done, a plurality of surface position data obtainable therefrom have random values.

In the present embodiment, by using such plural surface position data, an offset value (corrective amount) for detection of the surface position at an examination position 22 which is set at a central part of each pattern area of the wafer 2, is calculated. FIG. 6 is a flow chart showing the manner of calculating this offset value (corrective amount). Referring now to FIGS. 1 and 2 and to the flow chart of FIG. 6, the manner of calculating the offset value will be explained.

First, the wafer stage 3 is moved by means of the driving device 12 to displace a wafer 2 in the X-Y plane, so that a predetermined pattern area 21 of the wafer 2 (for example, a first shot area of the wafer 2) is aligned with the position at which the transfer of the reticle pattern is to be made.

Subsequently, at this site, the surface position of the examination position 22 in the pattern area 21 of the wafer 2 is measured by use of the surface position measuring system (4-11). Now, the measured value (surface position data) is denoted by Ao. Then, while retaining fixed the position of the wafer 2 in the direction of the optical axis AX of the projection lens system 1, namely, with respect to the height direction, the wafer 2 is moved in the X-Y plane by means of the stage 3 and the driving device 12 so that points (of a number n) of the grating 23 in FIG. 2 are sequentially brought into coincidence with the position at which the pinhole image is formed by the surface position measuring system (4-11), namely, the position of incidence of the light from the measuring system.

In this manner, the wafer 2 is displaced two-dimensionally in a direction or directions substantially parallel to the surface of the wafer, and at each of the grid points of a number n, the wafer surface position is measured by means of the surface position measuring system (4-11), whereby measured values (surface position data) of a number n are obtained. Here, the measured values of a number n are denoted by $A_j$ ($j=1-n$).

Since the position of the wafer in the height direction (the direction of the optical axis AX) which is substantially perpendicular to the surface of the wafer, is maintained fixed, any difference or differences among the measured values $A_j$ ($j=1-n$) of a number n, of the wafer surface position, are considered as being dependent only upon any difference in structure or placement of the pattern within the beam diameter of an inputted light beam at the grid points $1-n$. Therefore, if an average $\overline{A}$ of the measured values of the wafer surface position is calculated in accordance with the following equation:

$$\overline{A} = \sum_{j=1}^{n} (A_j/n)$$

then, the result is substantially the same as that which is to be obtained if the measurement and detection are executed in such a state wherein no eccentricity is produced in the intensity distribution, in the beam diameter, of the reflected light beam from the wafer 2, like that shown in FIG. 5. Accordingly, it is possible to obtain information of the surface position of the wafer 2 which is free from any detection error caused by the structure or placement of the pattern in the pattern area. Therefore, the surface position of the pattern area 21, at the examination position 22, having been subjected to the measurement can be represented by the average $\overline{A}$.

Subsequently, any difference between the average $\overline{A}$ and the measured value Ao obtained with respect to the examination position 22 which is a reference point for correction of the surface position to be made with respect to the pattern transfer, namely, $\overline{A}$-Ao, is calculated. Thus, the obtained value $\overline{A}$-Ao represents the detection error peculiar to the pattern, determined by the preceding process, of a particular pattern structure. Namely, it is the detection error peculiar to the wafer 2 which is being examined.

Subsequently, the value $\overline{A}$-Ao is added to a measured value (surface position data) of the wafer surface position at the measurement point (22) of each of the remaining pattern areas of the wafer 2, measured or to be measured through the measuring system (4-11), as a corrective amount (offset value) to be used when the surface position detection is to be made to the remaining pattern areas with the central part of each pattern area being set as a measurement point. By doing so, it is possible to detect the wafer surface position with respect to each pattern area, while excluding any detection error resulting from the pattern structure peculiar to the particular process.

The sequence described hereinbefore can be programmed in advance within the control device 13 shown in FIG. 1, and the corrective value ($\overline{A}$-Ao) can be memorized into a memory, not shown, of the control device 13.

In the reduction projection exposure apparatus shown in FIG. 1, the surface position of the pattern area of the wafer 2 is detected on the basis of the surface position data obtained through the surface position measuring system (4-11) with respect to the examination position in the pattern area as well as the corrective amount ($\overline{A}$-Ao), and the wafer 2 is displaced in the direction of the optical axis AX so as to reduce, to zero, the difference between the detected surface position and the image surface position of the projection lens system 1 which is predetected. By this, the image of the reticle pattern can be focused on the pattern area of the wafer 2. Such operation is repeated in sequence with regard to each of the remaining pattern areas of the wafer 2 and, along this, the reticle pattern is projected and transferred to each pattern area.

It is not necessary to execute, for each wafer, the measurement for calculation of the above-described corrective amount. It is sufficient to effect the measurement by using at least one of a set of wafers having been treated by the same process. Accordingly, for the wafers in one lot, a corrective amount may be calculated by using a particular pattern area of a first wafer in the lot, the calculated amount may be memorized into a memory, and the corrective amount memorized in the memory may be used for detection of the surface position with regard to each of a second wafer and the remaining wafers in the same lot. Alternatively, it may be sufficient to execute the measurement for calculation of the corrective amount, with regard to a first wafer, each time a used reticle is replaced by a fresh one. In any case, the affect on to the overall throughput of the semiconductor device manufacture is small.

Figure 8:
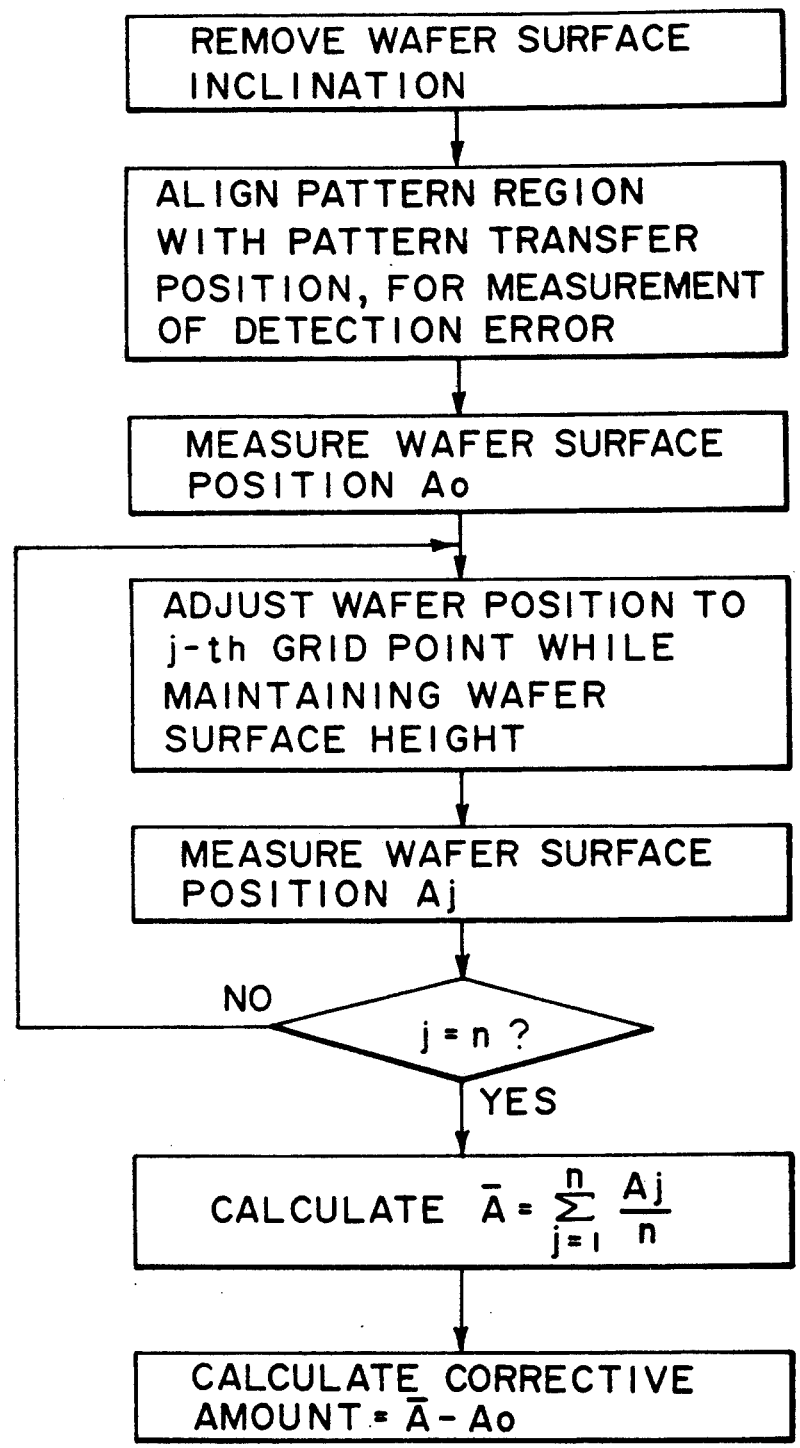
FIG. 8 is a flow chart, for explaining another embodiment of the surface position detecting method of the present invention.
Figure 9:
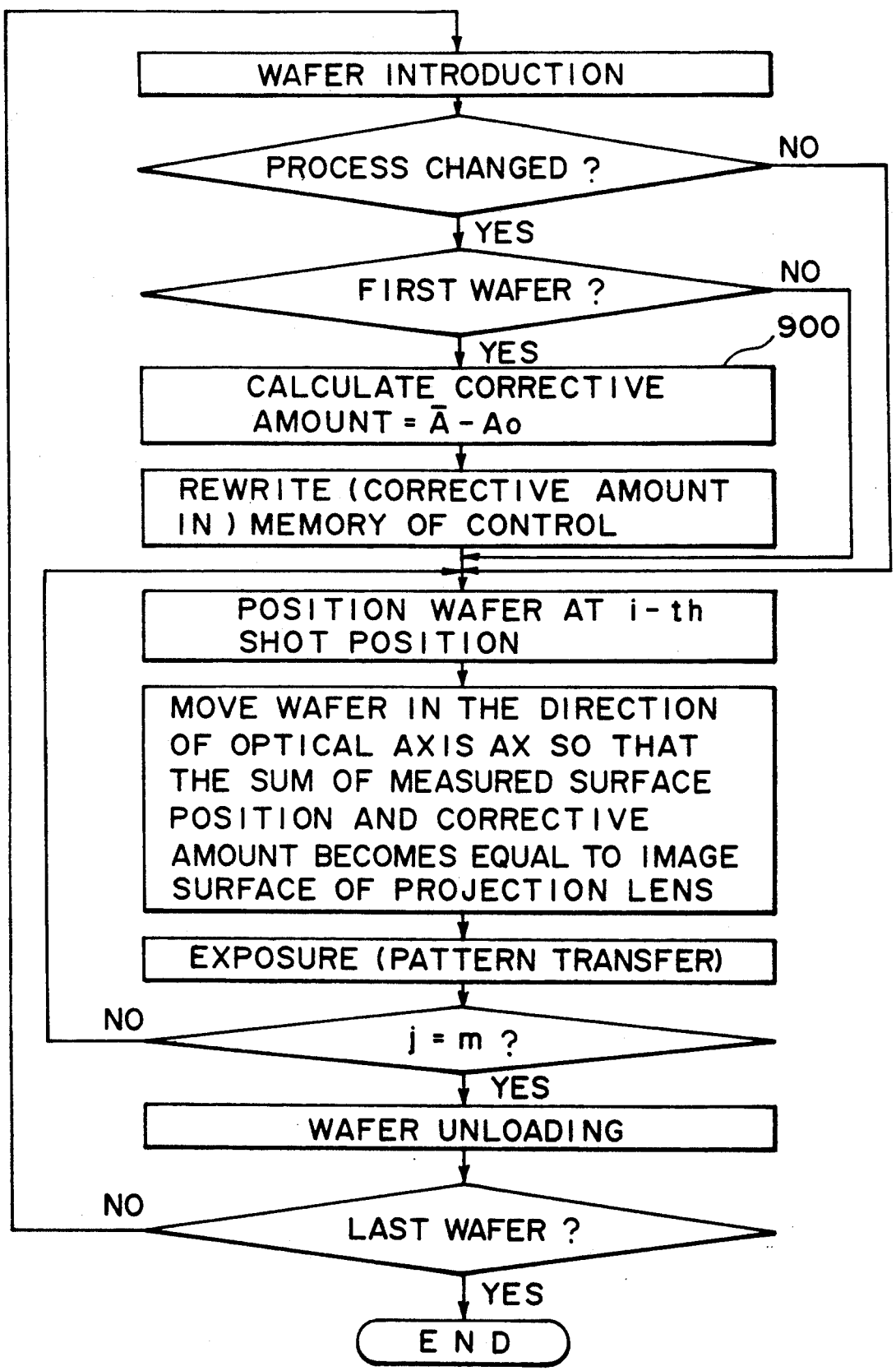
FIG. 9 is a flow chart showing an example of an exposure operation, including a surface position detecting step according to the surface position detecting method of the present invention.

FIG. 9 is a flow chart showing an exposure operation on an occasion when the calculation of a corrective amount is made for each lot. Corrective amount calculating step 900 shown in FIG. 9 may be executed in accordance with the sequence shown in FIG. 6 or that shown in FIG. 8 to be described later.

On the other hand, if it is desired to enhance the precision of the corrective amount, the above-described measurement and calculation may be made with regard to a plurality of pattern areas to obtain a plurality of corrective amounts, and an average of these corrective amounts may be determined as a corrective amount actually to be used. As a matter of course, one of or a plurality of pattern areas of each of different wafers (having been treated by the same process and thus having the same pattern structure) may be used to obtain a plurality of corrective amounts, and an actual corrective amount may be obtained from an average of these plural corrective amounts. This is effective to further enhance the precision of the corrective amount.

If, among the measured values of the surface position with regard to respective grid points set in a pattern area, there is such a value (extraordinary value) which is largely different from the remaining measured values, it is desirable not to use such a measured value in calculation of the corrective amount. Accordingly, in such a case, an average may be obtained from the remaining measured values to calculate the corrective amount.

While in the foregoing embodiment the surface positions of the grid points around the examination position 22 which is at the central part of the pattern area 21 are used as the measured values for calculation of an average $\overline{A}$, both the measured value of the surface position at the examination position 22 and the measured value of each grid point around it may be used for the calculation of the average $\overline{A}$.

If the reduction projection exposure apparatus of FIG. 1 is arranged so that the wafer stage 3 can be inclined with respect to the X-Y plane, high-precision surface position detection as well as high-precision corrective amount calculation, to be described below, are allowed.

FIG. 7 shows a pattern area 72 and pattern areas 71a-71c adjacent thereto, which are to be used for the measurement of a detection error. Numerals 70a-70c denote respective examination positions in the pattern areas 71a-71c at which the surface position measurement is to be made. Also, with regard to the pattern area 72, the examination position for measurement of the surface position is set at a central part thereof, like the pattern areas 71a-71c.

Since these pattern areas 71a-71c and 72 are formed on the same wafer, the patterns formed in the respective pattern areas, on the wafer substrate; which are below the respective measuring points 70a-70c are the same with respect to the pattern structure and the placement. Therefore, it can be considered that the detection errors to be caused when the surface positions at the measuring points 70a-70c are measured by use of the surface position measuring system (4-11) of FIG. 1, are the same.

By using this and by tilting the wafer stage 3 with respect to the X-Y plane and further by adjusting the inclination, with the use of the driving device 12, so that the results of measurement of the wafer surface position at the measuring points 70a-70c, become equal to each other, it is possible to substantially completely avoid the tilt of the pattern area 72 surface with respect to the X-Y plane. Therefore, when the measurement of the detection error is to be executed by using the grid points, such as shown in FIG. 3, for example, set with respect to a pattern area 72, it is possible to move the wafer stage 3 along the X-Y plane while maintaining the height of the wafer surface (pattern area 72) constant and to execute the measurement of the surface position at each grating point. As a result, it is possible to reduce a change in the measured value, due to a change in height of a grid point from another, to be caused when the wafer stage 3 is displaced, as a result of the inclination of the wafer 2 surface in the pattern area 72. Thus, it is possible to detect the detection error (corrective amount) with higher precision. FIG. 8 is a flow chart related to this embodiment.

While in the foregoing embodiments the measurement of the surface position at each grid point is executed while intermittently stopping the wafer stage with respect to the surface position measuring system (4–11), the surface position measurement at each grid point may be made while continuously moving the wafer stage, without stoppage, and by repeating the measurement through the measuring system (4–11) at a certain sampling interval. In this case, appropriate control is made to the light source 4 or the position detecting element 11, so that the light source is energized periodically or the surface position data is detected periodically. On the other hand, as a matter of course, it is a possible alternative that, while continuously moving the wafer stage, the surface position measurement as well as the emission of the light source are made continuously, the signal (surface position data) from the position detecting element 11 is integrated by use of an integrator and an integrated value obtainable therefrom is divided by the amount of movement of the wafer stage to obtain an average $\bar{A}$ of the surface position measurement.

In the embodiment shown in FIGS. 1 and 2, only the central part of the pattern area defined on the wafer 2 is used as the position to be examined. However, in addition to the central part, other four sites in the pattern area may be set as the positions to be examined. In such a case, a masking member having five pinholes formed therein may be used in place of the masking member 6 used in the FIG. 1 apparatus and, on the other hand, a two-dimensional sensor array (CCD) may be used as the position detecting element 11. By doing so, it is possible to measure the surface position at five locations in one pattern area, at the same time.

If corrective amounts respectively related to the measurements at the five measuring points in one pattern area of the wafer are detected by using the corrective amount (offset value) calculating method according to the present invention, for measurement of the surface position of each of a number of pattern areas having been treated by the same process, it is possible to detect, accurately, the surface position at five locations in each pattern area. Therefore, on the basis of the results of such a surface position detection, any inclination of each pattern area with respect to the image of the reticle pattern or to the X-Y plane can be corrected with high precision.

In accordance with the embodiments of the present invention, described hereinbefore, it is possible to detect the surface position of a particular pattern area on a wafer very accurately. Additionally, it is possible to measure, in a reduced time and with good precision, a corrective amount (offset value) corresponding to a detection error peculiar to each process different in the pattern structure. As a result, it is possible to reduce the time necessary for setting the semiconductor device manufacturing process or processes and, thus, it is possible to reduce the manufacturing cost. Further, when such a corrective amount (offset value) is used for correction of a measured value of a wafer surface position of another pattern area, the wafer surface position in such a pattern area can be detected more precisely. Therefore, it becomes easier to place the surface position of each pattern area correctly in the depth of focus of a projection optical system. Thus, the present invention ensures manufacture of semiconductor devices of a higher degree of integration as well as the manufacture of such with good yield.

In practical use of the present invention, as the light source 4 shown in FIG. 1, such a light source that emits lights of different colors or a plurality of light emitting diodes or semiconductor lasers that provide lights of different wavelengths (colors), may preferably be used so that the measurement of the surface position can be made by use of lights of different wavelengths (colors). This is preferable since it is effective to reduce a measurement error caused by the interference between light reflected from the wafer substrate and the pattern formed thereon with the light reflected from the surface of a resist applied to the wafer. Thus, the method of the present invention can be practiced with a higher precision.

Also, the present invention is not limited to use in a projection exposure apparatus. Namely, the present invention is effectively applicable to any case wherein the surface position of a surface, to be examined, having a fine pattern formed thereon is to be detected accurately. Thus, the form of an apparatus for embodying the method of the present invention is not limited to those disclosed in this Specification. By way of example, a measuring system for measuring the surface position may be supported movably in a direction substantially parallel to the surface to be examined and, while moving the measuring system, at plural measuring points the surface position of the surface being examined may be measured.

Further, similarly, an exposure apparatus to which the present invention is applicable is not limited to an optical projection exposure apparatus such as shown in FIG. 1. As an example, any one of various pattern generators such as one that uses an electron beam or a laser beam for pattern drawing, may be used.

In the embodiments described hereinbefore, for detection of a surface position of a pattern area or for calculation of a corrective amount, a plurality of surface position data obtained through a measuring system are averaged. However, the present invention is not limited thereto, but, as an example, these plural data may be processed by use of a least square method for detection of the surface position or the calculation of a corrective amount.

While the invention has been described with reference to the structures disclosed herein, it is not confined to the details set forth and this application is intended to cover such modifications or changes as may come within the purposes of the improvements or the scope of the following claims.

What is claimed is:

1. An error detecting method for use with a system for measuring through a measuring means a predetermined point on a surface to be examined on which a predetermined pattern is formed, to obtain surface position data related to the surface and for detecting the surface position related to the predetermined point on the surface being examined, on the basis of the obtained surface position data, wherein said method is effective to detect any error in the surface position data resulting from an affect of the pattern on the surface being examined, said method comprising:

- a measuring step for relatively moving the measuring means and the surface being examined, in a direction substantially parallel to the surface being examined, and sequentially measuring the predetermined point on the surface being examined and a plurality of points thereon adjacent to the predetermined point by use of the measuring means;
- a first determining step for determining the surface position, with respect to the predetermined point, of the surface being examined on the basis of a plurality of surface position data obtained in the measuring step;
- a second determining step for determining the surface position, with respect to the predetermined point, of the surface being examined on the basis of surface position data related to the predetermined point and obtained in the measuring step; and
- a detecting step for detecting any error in the surface position data related to the surface being examined, on the basis of any difference between the surface positions determined in said first and second determining steps.

2. A method according to claim 1, further comprising projecting the radiation beam to the surface being examined by the measuring means, and wherein the step of determining the surface position data comprises detecting any portion of the radiation beam reflected by the surface being examined.

3. A method according to claim 2, wherein one of the plurality of surface position data used in the first determining step is the surface position data related to the predetermined point.

4. A method for use with an apparatus for projecting through a projection optical system a first pattern formed on a first object onto a second object having a second pattern formed thereon, for detecting a surface position of the second object with respect to a direction of an optical axis of the projection optical system on the basis of a signal form a detector obtained by irradiating the surface of the second object with a radiation beam and by converting, into the signal, the beam reflected from the second object and received by the detector, said method comprising:

- a beam irradiation and signal conversion step for moving the second object in a direction substantially perpendicular to the optical axis of the projection optical system and effecting beam irradiation with a plurality of light beams having a plurality of different wavelengths and signal conversion of a plurality of different points, including a predetermined point and points adjacent to the predetermined point, on the surface of the second object;
- a detecting step for detecting the surface position of the second object with respect to the predetermined point, on the basis of a plurality of signals obtained through the beam irradiation and signal conversion step;
- a difference detecting step for detecting any difference between the surface position detected in the detecting step and the surface position related to the predetermined point, as represented by a signal obtained through the beam irradiation and signal conversion made to the predetermined point; and
- a step of memorizing any difference detected in said difference detecting step.

5. A method for use with an apparatus for projecting through a projection optical system a first pattern formed on a first object onto each of different pattern areas arrayed on a second object and having respective second patterns, for detecting surface positions of first and second pattern areas on the second object with respect to a direction of an optical axis of the projection optical system, wherein said method is of a type that the surface position of a given pattern area can be detected on the basis of a signal from a detector obtained by irradiating a surface of the given pattern area with a radiation beam and by converting into the signal the beam reflected from the surface and received by the detector, said method comprising:

- a first measuring step for moving the second object in a direction substantially perpendicular to the optical axis of the projection optical system, and effecting the beam irradiation and signal conversion to a predetermined point on the first pattern area and to a plurality of points adjacent to the predetermined point;
- a first detecting step for detecting a surface position of the first pattern area at the predetermined point thereon, on the basis of a plurality of signals obtained through the first measuring step;
- a determining step for detecting a difference between the surface position as detected through the first detecting step and the surface position represented by a signal related to the predetermined point and obtained through the first measuring step, to determine an offset value;
- a second measuring step for effecting the beam irradiation and signal conversion to a particular point on the second pattern area which corresponds to the predetermined point on the first pattern area; and
- a second detecting step for correcting a signal obtained through the second measuring step, by use of the offset value determined through the determining step, to detect the surface position of the second pattern area at the particular point.

6. A method according to claim 5, further comprising effecting said first detecting step on the basis of a signal related to the predetermined point and signals related to the plurality of points.

7. A method according to claim 5, further comprising effecting said first detecting step on the basis of signals related to the plurality of points.

8. A method according to claim 6 or 7, wherein the radiation beam includes light beams of different wavelengths.

9. A method for use with an apparatus for projecting through a projection optical system a first pattern formed on a first object onto a second object having a second pattern, for detecting a surface position of the second object with respect to a direction of an optical axis of the projection optical system on the basis of a signal from a detector obtained by irradiating the surface of the second object with a radiation beam and by converting, into the signal, the beam reflected by the surface of the second object received by the detector, said method comprising:

a first setting step for setting a third object having the same pattern as the second pattern, at a site below the projection optical system;

a first measuring step for moving the third object in a direction substantially perpendicular to the optical axis of the projection optical system, irradiating with a radiation beam in sequence a predetermined point on the third object and a plurality of points adjacent to the predetermined point, and converting into signals in sequence the beams reflected from the irradiated points and received by the detector;

a first detecting step for detecting the surface position of the third object at the predetermined point, on the basis of signals obtained through the first measuring step;

a determining step for detecting any difference between the surface position as detected through the first detecting step and the surface position as represented by a signal related to the predetermined point and obtained through the first measuring step, to determine an offset value;

a second setting step for setting the second object in place of the third object, at the site below the projection optical system;

a second measuring step for irradiating with a radiation beam a particular point on the second object which corresponds to the predetermined point on the third object, and converting into a signal the beam reflected from the irradiated point and received by the detector; and a second detecting step for correcting the signal obtained through the second measuring step by use of the offset value obtained through the determining step, to detect the surface position of the second object at the particular point.

10. A method according to claim 9, further comprising effecting said first detecting step on the basis of a signal related to the predetermined point and signals related to the plurality of points.

11. A method according to claim 9, further comprising effecting said first detecting step on the basis of signals related to the plurality of points.

12. A method according to claim 10 or 11, wherein the radiation beam includes light beams of different wavelengths.

13. A method for manufacture of semiconductor devices wherein a detection beam is projected to a predetermined point on a zone of a wafer to produce a reflection beam corresponding to height of that point, deviation of the zone from a focal plane of a projection optical system is detected by using a signal generated from the reflection beam and after correction of the deviation, radiation energy is projected to the zone through the projection optical system to print a circuit pattern onto the zone, said method comprising the steps of:

sequentially projecting a detection beam to a first point on a first zone of a wafer and to different points on the wafer adjacent to the first point;

producing a first signal by using reflection beams from the different points;

producing a second signal by using a reflection beam from the first point;

producing an offset signal corresponding to a difference between the first and second signals;

projecting a detection beam to a second point on a second zone of the wafer and producing a third signal by using a reflection beam from the second point, wherein the second point on the second zone corresponds to the first point on the first zone; and detecting and correcting a deviation of the second zone of the wafer from the focal plane of the projection optical system by using the offset signal and the third signal.

14. A method according to claim 13, wherein the step of producing the first signal further comprises using the reflection light from the first point.

15. A method according to claim 13, wherein the first point is in a central area of the first zone and wherein the second point is in a central area of the second zone.

16. A method according to claim 13, wherein the step of producing the first signal comprises (i) photoelectrically converting the reflection beams from the different points through a position detecting sensor in sequence to produce electrical signals corresponding to positions of incidence of the reflection beams upon the sensor, and (ii) averaging the electrical signals produced to obtain the first signal, and wherein the step of producing the second signal and the step of producing the third signal each comprise photoelectric conversion of the reflection beam from a corresponding one of the first and second points through the sensor.

17. A method according to claim 14, wherein the step of producing the first signal comprises (i) photoelectrically converting the reflection beams from the different points through a position detecting sensor in sequence to produce electrical signals corresponding to positions of incidence of the reflection beams upon the sensor, and (ii) averaging the electrical signals produced to obtain the first signal, and wherein the step of producing the second signal and the step of producing the third signal each comprise photoelectric conversion of the reflection beam from a corresponding one of the first and second points through the sensor.

18. A method for manufacture of semiconductor devices wherein a detection beam is projected to a predetermined point on a zone of a wafer to produce a reflection beam corresponding to height of that point, deviation of the zone from a focal plane of a projection optical system is detected by using a signal generated from the reflection beam and after the deviation is corrected, radiation energy is projected to the zone through the projection optical system to print a circuit pattern onto the zone, said method comprising the steps of:

sequentially projecting a detection beam to a first point on a first zone of a first wafer and to different points on the first wafer adjacent to the first point;

producing a first signal by using reflection beams from the different points;

producing a second signal by using a reflection beam from the first point;

producing an offset signal corresponding to a difference between the first and second signals;

projecting a detection beam to a second point on a second zone of a second wafer different from the first wafer, which second point corresponds to the first point on the first zone of the first wafer, and producing a third signal by using a reflection beam from the second point; and detecting and correcting a deviation of the second zone of the second wafer from the focal plane of the projection optical system by using the offset signal and the third signal.

19. A method according to claim 18, wherein the step of producing the first signal further comprises using the reflection light from the first point.

20. A method according to claim 18, wherein the first point is in a central area of the first zone of the first wafer and the second point is in a corresponding central area of the second zone of the second wafer.

21. A method according to claim 18, wherein the step of producing the first signal comprises (i) photoelectrically converting the reflection beams from the different points through a position detecting sensor in sequence to produce electrical signals corresponding to positions of incidence of the reflection beams upon the sensor, and (ii) averaging the electrical signals produced to obtain the first signal, and wherein the step of producing the second signal and the step of producing the third signal each comprise photoelectric conversion of the reflection beam from a corresponding one of the first and second points through the sensor.

22. A method according to claim 19, wherein the step of producing the first signal comprises (i) photoelectrically converting the reflection beams from the different points through a position detecting sensor in sequence to produce electrical signals corresponding to positions of incidence of the reflection beams upon the sensor, and (ii) averaging the electrical signals produced to obtain the first signal, and wherein the step of producing the second signal and the step of producing the third signal each comprise photoelectric conversion of the reflection beam from a corresponding one of the first and second points through the sensor.

23. A method for manufacture of semiconductor devices, said method comprising the steps of:
irradiating a reference point on a first zone of a semiconductor wafer with light to produce first information related to height of the reference point, on the basis of a light beam reflected form the reference point;
irradiating sample points on the first zone of the wafer with light to produce second information related to heights of the sample points, on the basis of light beams reflected from the sample points;
determining a corrective quantity on the basis of a difference between the first information and the second information;
irradiating a corresponding reference point on a second zone of the wafer with light;
determining a deviation of a surface position of the second zone, with respect to a focal plane of a projection optical system, on the basis of a light beam reflected from the corresponding reference point and the corrective quantity determined in said determining step;
correcting the determined deviation of the second zone with respect to the focal plane of the projection optical system; and
supplying radiation energy to the second zone of the wafer to print a pattern, for semiconductor device manufacture, on the second zone.

24. A method according to claim 23, wherein the reference point is one of the sample points.

25. A method according to claim 23, wherein the step of determining a corrective quantity comprises using an average height of the sample points.

26. A method according to claim 23, further comprising sequentially irradiating the sample points.

27. A method according to claim 23, wherein the reference point is substantially in the center of the first zone.

28. A method according to claim 23, wherein the second information relates to an average height of the sample points.

29. A method according to claim 24, wherein the second information relates to an average height of the sample points.

30. A method for manufacture of semiconductor devices, said method comprising the steps of:
irradiating a reference point on a first zone of a first wafer with light to produce first information related to height of the reference point, on the basis of a light beam reflected from the reference point;
irradiating sample points on the first zone of the first wafer with light to produce second information related to heights of the sample points, on the basis of light beams reflected from the sample points;
determining a corrective quantity on the basis of a difference between the first information and the second information;
irradiating a corresponding reference point on a second zone of a second wafer with light;
determining a deviation of a surface position of the second zone of the second wafer, with respect to a focal plane of a projection optical system, on the basis of a light beam reflected from the corresponding reference point and the corrective quantity determined in said determining step;
correcting the determined deviation of the second zone of the second wafer with respect to the focal plane of the projection optical system; and
supplying radiation energy to the second zone of the second wafer to print a pattern, for semiconductor device manufacture, on the second zone.

31. A method according to claim 30, wherein the reference point is one of the sample points.

32. A method according to claim 30, wherein the step of determining the corrective quantity further comprises using an average height of the sample points.

33. A method according to claim 30, further comprising sequentially irradiating the sample points.

34. A method according to claim 30, wherein the reference point is substantially in the center of the first zone.

35. A method according to claim 30, wherein the second information relates to an average height of the sample points.

36. A method according to claim 31, wherein the second information relates to an average height of the sample points.

37. A method for manufacture of semiconductor devices, said method comprising the steps of:
irradiating sample points on a first zone of a wafer with light;
receiving, through a sensor, light beams reflected from the sample points;
determining a corrective quantity on the basis of a difference between (i) a position of incidence upon the sensor of a reflected light beam from a first sample point of the sample points, and (ii) positions of incidence upon the sensor of reflected light beams from those of the sample points other than the first sample point;
irradiating a sample point on a second zone of the wafer with light, wherein the sample point on the second zone corresponds to the first sample point on the first zone;
determining a deviation of a surface position of the second zone, with respect to a focal plane of a projection optical system, on the basis of a light beam reflected from the sample point on the second zone and the corrective quantity determined in said determining step;

correcting the determined deviation of the second zone with respect to the focal plane of the projection optical system; and supplying radiation energy to the second zone of the wafer to print a pattern, for semiconductor device manufacture, on the second zone.

38. A method according to claim 37, wherein the position of incidence upon the sensor of each reflected light beam represents height of a corresponding sample point.

39. A method according to claim 38, wherein the step of determining the corrective quantity comprises comparing height of the first sample point with an average height of those sample points other than the first sample point.

40. A method according to claim 38, further comprising sequentially irradiating the sample points.

41. A method according to claim 38, wherein the first sample point is substantially in the center of the first zone, and wherein the sample point on the second zone is substantially in the center of the second zone.

42. A method for manufacture of semiconductor devices, said method comprising the steps of:

irradiating sample points on a first zone of a first wafer with light;

receiving, through a sensor, light beams reflected from the sample points;

determining a corrective quantity on the basis of a difference between (i) a position of incidence upon the sensor of a reflected light beam from a first sample point of the sample points, and (ii) positions of incidence upon the sensor of reflected light beams from those of the sample points other than the first sample point;

irradiating a sample point on a second zone of a second wafer with light, wherein the sample point on the second zone corresponds to the first sample point on the first zone;

determining a deviation of a surface position of the second zone of the second wafer, with respect to a focal plane of a projection optical system, on the basis of a light beam reflected from the sample point on the second zone of the second wafer and the corrective quantity determined in said determining step;

correcting the determined deviation of the second zone of the second wafer with respect to the focal plane of the projection optical system; and supplying radiation energy to the second zone of the second wafer to print a pattern, for semiconductor device manufacture, on the second zone.

43. A method according to claim 42, wherein the position of incidence upon the sensor of each reflected light beam represents height of a corresponding sample point.

44. A method according to claim 43, wherein the step of determining the corrective quantity comprises comparing height of the first sample point with an average height of those sample points other than the first sample point.

45. A method according to claim 43, further comprising sequentially irradiating the sample points on the first zone of the first wafer.

46. A method according to claim 43, wherein the first sample point is substantially in the center of the first zone of the first wafer, and wherein the sample point on the second zone of the second wafer is substantially in the center of the second zone.

47. In an error detecting method wherein a radiation beam is projected to a predetermined point on a surface of a substrate having a fine pattern and a quantity related to the level of the predetermined point is determined by using a beam reflected from the substrate, and wherein the determined quantity may contain an error due to an affect of the pattern the improvement comprising the steps of:

projecting the radiation beam to a plurality of secondary points on the surface of the substrate, adjacent to the predetermined point, and determining a plurality of secondary quantities related to the levels of the secondary points on the basis of reflected beams from the secondary points;

calculating one of (i) an average of the secondary quantities and (ii) an average of the secondary quantities and the quantity related to the level of the predetermined point; and calculating a difference between the calculated average and the quantity related to the level of the predetermined point.

48. A method according to claim 47, wherein said projecting step comprises projecting a radiation beam including light of different colors.

49. A method according to claim 47, wherein the substrate comprises a wafer having a circuit pattern formed thereon.

50. A method according to claim 47, further comprising displacing the substrate relative to the radiation beam along a plane substantially parallel to the surface of the substrate, whereby the secondary points on the surface of the substrate are irradiated with the radiation beam.

51. In a semiconductor device manufacturing method usable with a wafer having first and second surface zones each having a first fine pattern formed thereon, wherein a radiation beam is projected to a first sample point on the first surface zone of the wafer and a quantity related to the level of the first sample point is determined by using a beam reflected from the wafer, and wherein the level of the first surface zone of the wafer is adjusted on the basis of the determined quantity and thereafter a second fine pattern is printed on the first surface zone of the wafer, the improvement comprising the steps of:

adjusting the level of the first surface zone by correcting an error in the determined quantity related to the level of the first sample point, wherein the error is attributable to an affect of the first fine pattern;

projecting a radiation beam to (i) a second sample point on the second surface zone of the wafer, corresponding to the first sample point on the first surface zone of the wafer, and (ii) a plurality of secondary points on the second surface zone, adjacent to the second sample point, and determining a quantity related to the level of the second sample point on the basis of a reflected beam from the second sample point, while determining a plurality of secondary quantities related to the levels of the secondary points on the basis of reflected beams from the secondary points adjacent to the second sample point;

calculating one of (i) an average of the secondary quantities and (ii) an average of the secondary quantities and the quantity related to the level of the second sample point; and determining a difference between the calculated average and the quantity related to the level of the second sample point to determine error in the quantity related to the level of the first sample point on the surface zone of the wafer.

52. A method according to claim 51, wherein said projecting step comprises projecting a radiation beam including light of different colors.

53. A method according to claim 51, further comprising displacing the wafer relative to the radiation beam along a plane substantially parallel to the wafer, whereby the second sample point and the second points on the second surface zone of the wafer are irradiated with the radiation beam.

54. In a semiconductor device manufacturing method usable with first and second wafers each having a first fine pattern formed thereon, wherein a radiation beam is projected to a first sample point on the first wafer and a quantity related to the level of the first sample point is determined by using a beam reflected from the first wafer, and wherein the level of the first sample point on the first wafer is adjusted on the basis of the determined quantity and thereafter a second fine pattern is printed on the first wafer, the improvement comprising the steps of:

adjusting the level of the first sample point on the first wafer by correcting an error in the determined quantity related to the level of the first sample point, wherein the error is attributable to an affect of the first fine pattern;

projecting a radiation beam to (i) a second sample point on the second wafer, corresponding to the first sample point on the first wafer, and (ii) a plurality of secondary points on the second wafer, adjacent to the second sample point, and determining a quantity related to the level of the second sample point on the basis of a reflected beam from the second sample point, while determining a plurality of secondary quantities related to the levels of the secondary points on the basis of reflected beams from the secondary points adjacent to the second sample point;

calculating one of (i) an average of the secondary quantities and (ii) an average of the secondary quantities and the quantity related to the level of the second sample point; and determining a difference between the calculated average and the quantity related to the level of the second sample point to determine the error in the quantity related to the level of the first sample point on the first wafer.

55. A method according to claim 54, wherein said projecting step comprises projecting a radiation beam including light of different colors.

56. A method according to claim 54, further comprising displacing the second wafer relative to the radiation beam along a plane substantially parallel to the second wafer, whereby the second sample point and the secondary points on the second wafer are irradiated with the radiation beam.

57. An exposure apparatus comprising:

a movable stage for carrying thereon a wafer having a fine pattern formed thereon;

an optical sensor system for projecting a radiation beam to the surface of the wafer, for receiving a beam reflected from the wafer surface and for producing a signal related to the level of the surface of the wafer in response to the received beam; and control means for moving said movable stage along a plane substantially parallel to the wafer surface, said control means comprising means for causing said optical sensor system to produce a first signal related to the level of a predetermined point on the wafer surface and secondary signals related to levels of a plurality of secondary points on the wafer surface, adjacent to the predetermined point, and further comprising means for calculating one of (i) an average of the secondary signals and (ii) an average of the first signal and the secondary signals, and means for producing an offset signal corresponding to a difference between the first signal and the calculated average.

58. An apparatus according to claim 57, wherein the radiation beam comprises light of different colors.

59. An apparatus according to claim 57, wherein the wafer includes a plurality of arrayed zones each having the same pattern, and wherein said control means further comprises means for causing said sensor system to produce (i) a first signal related to the level of a predetermined point on a predetermined one of the zones and (ii) secondary signals related to levels of a plurality of secondary points on the predetermined zone of the wafer, adjacent to the predetermined point.

60. An apparatus according to claim 59, wherein said control means further comprises means for causing said sensor system to produce a first signal related to the level of a predetermined point on a second zone of the wafer, different from the predetermined zone, and to correct the produced first signal by using the offset signal.

61. An apparatus according to claim 59, wherein, when a second wafer having arrayed zones corresponding to the zones of the first wafer is placed on said stage, said control means further comprises means for causing said sensor system to produce a first signal related to a predetermined point on a predetermined one of the zones of the second wafer, corresponding to the predetermined point on the first wafer, and means for correcting the produced first signal by using the offset signal.

* * * * *

UNITED STATES PATENT AND TRADEMARK OFFICE
CERTIFICATE OF CORRECTION

PATENT NO. : 5,124,562
DATED : June 23, 1992
INVENTOR(S) : Haruna Kawashima, et al.

It is certified that error appears in the above-identified patent and that said Letters Patent is hereby corrected as shown below:

COLUMN 3

Line 39, "affect" should read --effect--; and
Line 44, "affect" should read --effect--.

COLUMN 6

Line 17, "where in" should read --wherein--.

COLUMN 11

Line 67, "affect" should read --effect--.

COLUMN 15

Line 7, "affect" should read --effect--; and
Line 47, "form" should read --from--.

UNITED STATES PATENT AND TRADEMARK OFFICE
CERTIFICATE OF CORRECTION

PATENT NO. : 5,124,562
DATED : June 22, 1992
INVENTOR(S) : Haruna Kawashima, et al.

It is certified that error appears in the above-indentified patent and that said Letters Patent is hereby corrected as shown below:

Column 22, line 12, "affect" should read --effect--.

Signed and Sealed this

Seventh Day of September, 1993

Attest:

BRUCE LEHMAN

Attesting Officer     Commissioner of Patents and Trademarks